US007096142B2

(12) United States Patent
Kolman

(10) Patent No.: US 7,096,142 B2
(45) Date of Patent: Aug. 22, 2006

(54) REPORT FORMAT EDITOR FOR CIRCUIT TEST

(75) Inventor: Robert Stanley Kolman, Longmont, CO (US)

(73) Assignee: Agilent Technologies, Inc., Palo Alto, CA (US)

( * ) Notice: Subject to any disclaimer, the term of this patent is extended or adjusted under 35 U.S.C. 154(b) by 319 days.

(21) Appl. No.: 10/817,305

(22) Filed: Apr. 2, 2004

(65) Prior Publication Data

US 2005/0222797 A1 Oct. 6, 2005

(51) Int. Cl.
*G06F 19/00* (2006.01)

(52) U.S. Cl. .................. 702/123; 702/117; 702/119; 702/120; 324/537; 324/765; 716/4

(58) Field of Classification Search ............ None
See application file for complete search history.

(56) References Cited

U.S. PATENT DOCUMENTS

| 5,721,903 | A | * | 2/1998 | Anand et al. ............. 707/5 |
| 5,784,275 | A | * | 7/1998 | Sojoodi et al. ........... 700/86 |
| 5,852,796 | A | * | 12/1998 | Stepanenko, Jr. ......... 702/176 |
| 5,862,395 | A | * | 1/1999 | Bier ........................... 712/1 |
| 5,920,479 | A | * | 7/1999 | Sojoodi et al. ........... 700/86 |
| 6,202,201 | B1 | * | 3/2001 | Domi ........................ 717/136 |
| 6,449,741 | B1 | * | 9/2002 | Organ et al. ............. 714/724 |
| 6,542,841 | B1 | * | 4/2003 | Snyder ..................... 702/104 |
| 6,721,286 | B1 | * | 4/2004 | Williams et al. ......... 370/282 |
| 6,745,140 | B1 | * | 6/2004 | Sutton ....................... 702/67 |
| 6,754,885 | B1 | * | 6/2004 | Dardinski et al. ....... 717/113 |
| 6,823,272 | B1 | * | 11/2004 | Sutton ....................... 702/58 |
| 6,961,871 | B1 | * | 11/2005 | Danialy et al. ........... 714/300 |
| 2001/0052110 | A1 | * | 12/2001 | Orbanes et al. ............ 717/1 |
| 2002/0193966 | A1 | * | 12/2002 | Buote et al. .............. 702/183 |
| 2003/0160822 | A1 | * | 8/2003 | Belz et al. ................ 345/762 |
| 2003/0182075 | A1 | * | 9/2003 | Sutton et al. ............. 702/123 |
| 2004/0221233 | A1 | * | 11/2004 | Thielen .................... 715/530 |
| 2005/0102323 | A1 | * | 5/2005 | Henderson et al. ...... 707/104.1 |
| 2005/0102572 | A1 | * | 5/2005 | Oberlaender .............. 714/29 |
| 2005/0143947 | A1 | * | 6/2005 | James ....................... 702/122 |
| 2005/0143958 | A1 | * | 6/2005 | James ....................... 702/188 |
| 2006/0036394 | A1 | * | 2/2006 | Chen et al. ............... 702/123 |

* cited by examiner

*Primary Examiner*—Patrick J. Assouad

(57) ABSTRACT

A graphical user interface (GUI) of a report format editor for circuit test displays a number of user-selectable representations of circuit test data. The GUI also displays a user-modifiable ASCII report format that is formed, at least in part, of placed ones of the user-selectable representations of circuit test data. Program code interprets the relative sizes and placements of elements forming the user-modifiable ASCII report format, and generates an ASCII format description file in response to the interpretation. A circuit test system then formats circuit test data in accordance with the ASCII format description file.

18 Claims, 4 Drawing Sheets

REPORT FORMAT EDITOR FOR CIRCUIT TEST

BACKGROUND OF THE INVENTION

Some circuit test systems output circuit test data in accordance with a fixed report format. Other circuit test systems allow circuit test data to be mapped to arbitrary locations. However, these latter circuit test systems require a user to understand low-level details of the system's output data, as well as a programming language such as "C".

SUMMARY OF THE INVENTION

One aspect of the invention is embodied in a report format editor for circuit test. The editor comprises code to display a graphical user interface (GUI). The GUI, in turn, displays 1) a number of user-selectable representations of circuit test data, and 2) a user-modifiable ASCII report format that is formed, at least in part, of placed ones of the user-selectable representations of circuit test data. Program code interprets relative sizes and placements of elements forming the user-modifiable ASCII report format and generates an ASCII format description file in response to the interpretation.

Other embodiments of the invention are also disclosed.

BRIEF DESCRIPTION OF THE DRAWINGS

Illustrative and presently preferred embodiments of the invention are illustrated in the drawings, in which.

DESCRIPTION OF THE PREFERRED EMBODIMENT

Figure 1:
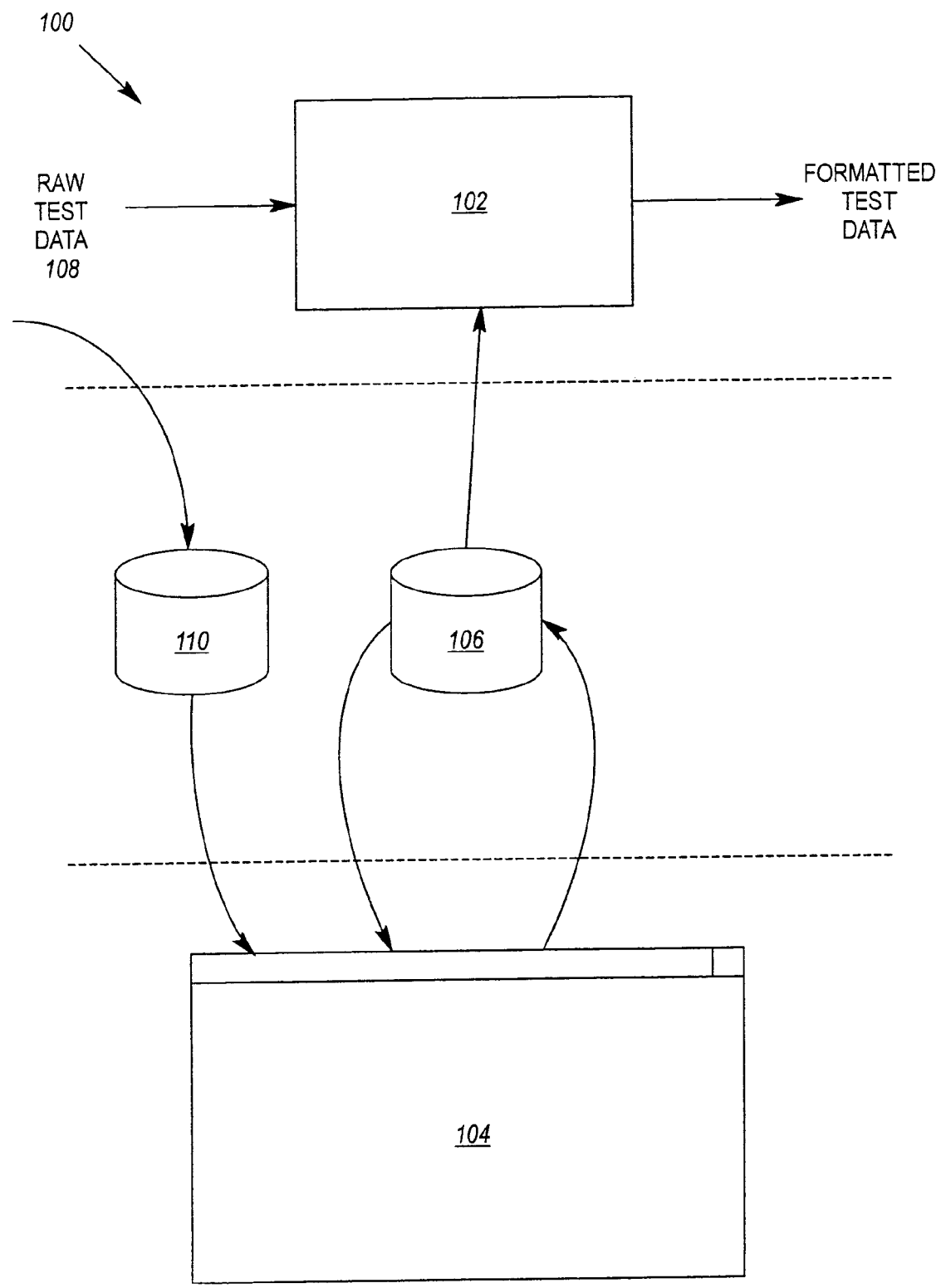
FIG. 1 illustrates exemplary code portions of a circuit test system.

FIG. 1 illustrates an exemplary circuit test system 100 comprising various pieces of program code 102, 104, 106. By way of example, the program code may be stored on various forms or combinations of computer readable media, including any one or more of: fixed disks, removable disks, random access memories (RAMs), read only memories (ROMs), magnetic disks, and optical discs. Further, and by way of example, the program code may be installed on a circuit tester (e.g., the 93000 System on a Chip (SOC) tester, manufactured by Agilent Technologies, Inc. of Palo Alto, Calif., USA), on a computer system (e.g., a personal computer (PC)), or over a network (e.g., with parts of the code being installed on a circuit tester, and with parts of the code being stored on a personal computer).

In the upper portion of the system 100 (above the upper hash line), circuit test data flows from left to right and is processed by program code 102 that reads an ASCII format description file 106 and formats the test data in accordance therewith. In one embodiment, the code 102 receives and processes a real-time stream of circuit test data 108 as the data is generated during circuit test. In another embodiment, the code 102 might receive and processes the circuit test data in batches. In yet another embodiment, the code 102 might access and process a stored file of circuit test data.

Figure 2:
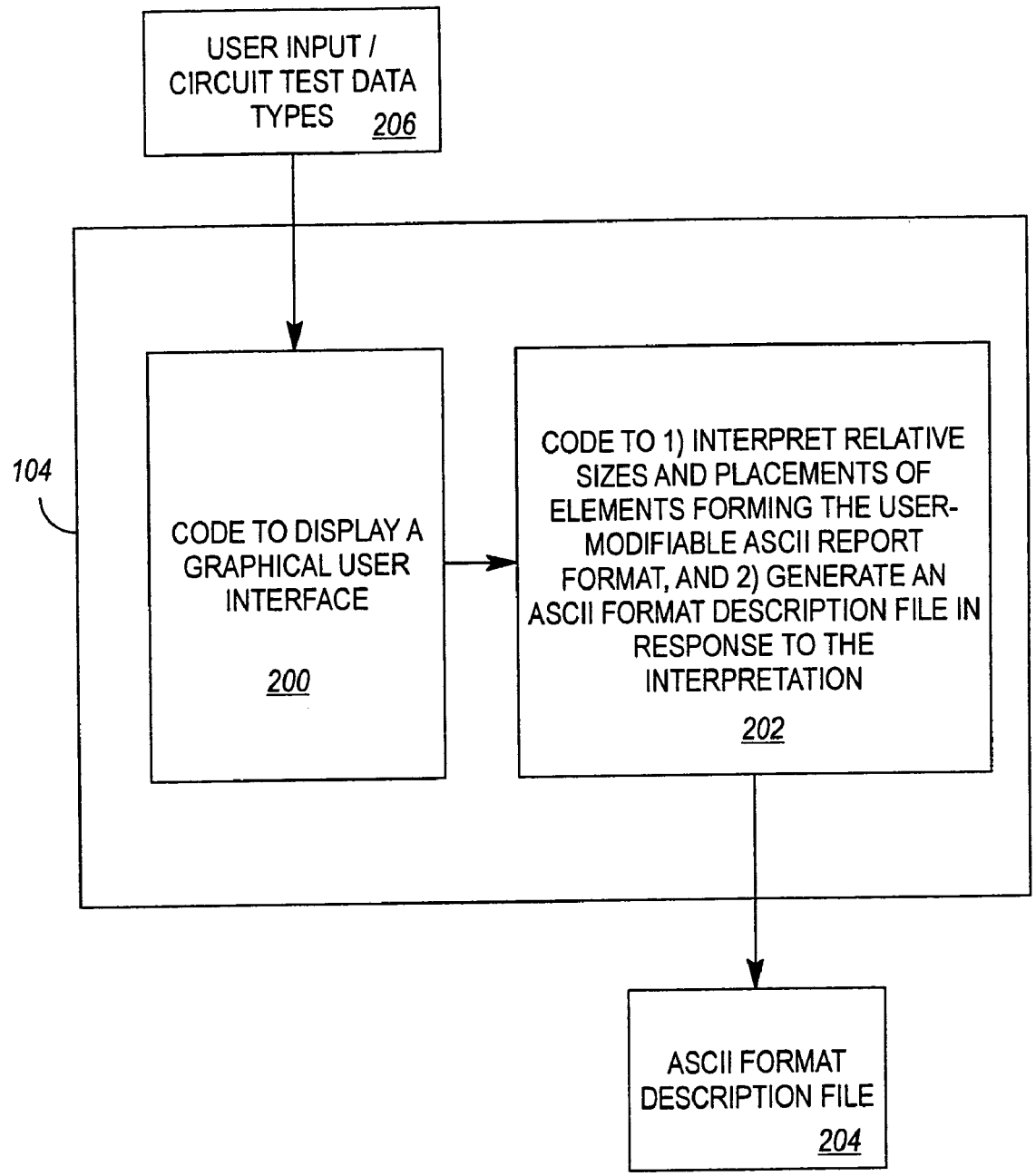
FIG. 2 illustrates exemplary code portions of the report format editor shown in FIG. 1.
Figure 3:
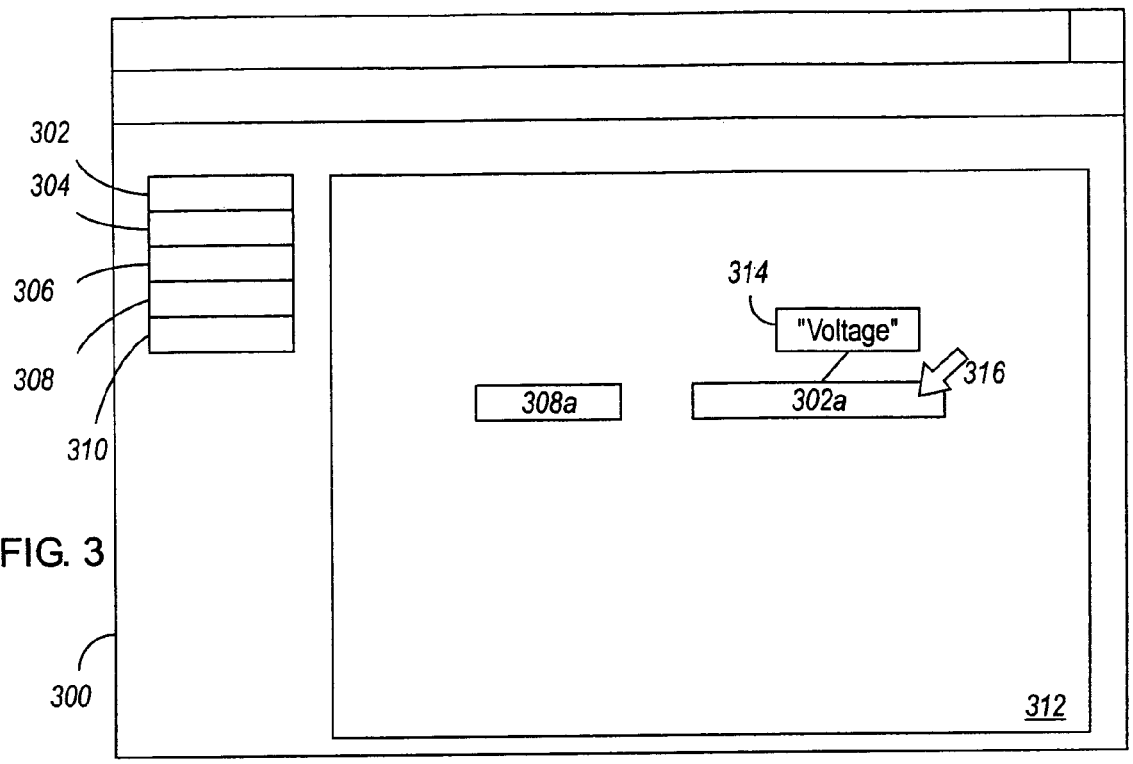
FIGS. 3–6 illustrate various graphical user interfaces that might be displayed by the report format editor shown in FIG. 2.
Figure 4:
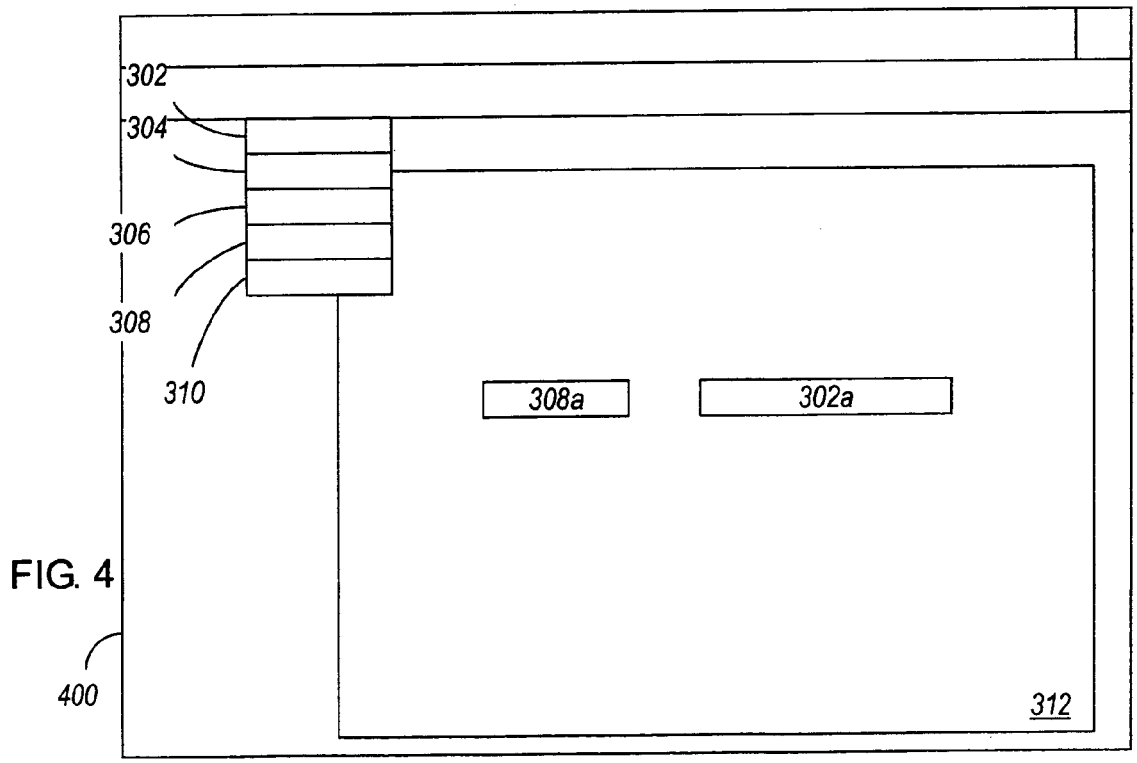

The lower portion of the system (below the lower hash line) comprises a report format editor 104. As shown in FIG. 2, the report format editor 104 comprises code 200 to display a graphical user interface (GUI). As shown in FIG. 3, the GUI 300 displays a number of user-selectable representations of circuit test data 302, 304, 306, 308, 310, as well as a user-modifiable ASCII report format 312 that is formed, at least in part, of placed ones of the user-selectable representations of circuit test data 302a, 308a. In one embodiment, the representations of circuit test data 302–310 comprise names of circuit test data that are displayed in a persistently visible portion of the GUI 300 (e.g., in a persistently visible list of circuit test data names; see FIG. 3). Alternately, the representations of circuit test data 302–310 may be provided via a pull-down menu of the GUI 400 (see FIG. 4). The representations of circuit test data 302–310 may also comprise exemplary depictions (e.g., icons) of the circuit test data, or colors that identify the circuit test data. Regardless of how the representations of circuit test data 302–310 are provided, the report format editor 104 preferably comprises code that enables a user to drag and drop the representations within the ASCII report format 312. Once a representation of circuit test data has been placed within the ASCII report format, it may continue to be represented by its name or icon. However, it is preferably represented by an exemplary data string (e.g., "x,xxx.xx" or "_data_"). As will be described later, placed test data may also be identified by other means.

The report format editor 104 (FIG. 2) further comprises program code 202 to 1) interpret relative sizes and placements of elements forming the user-modifiable ASCII report format, and 2) generate the ASCII format description file 204 in response to the interpretation. In this manner, a user (through user input 206) can graphically create and/or manipulate the format of data that is output from the system 100.

As shown in FIG. 1, the upper and lower portions of the circuit test system 100 both access the same ASCII format description file 106. In some embodiments, this description file may also be manually edited by means of a simple text editor or other editing software. The report format editor 104 may therefore comprise code to conduct a consistency check on the contents of the description file 106. Preferably, the consistency check is automatically conducted each time the file 104 is read. However, the user could also be given an option to manually trigger the consistency check from within the report format editor 104.

The report format editor 104 may also comprise code to build the number of user-selectable representations of circuit test data 302–310 that it displays. In one embodiment, this code reads a file of circuit test data types 110 and, in response thereto, builds the user-selectable representations of circuit test data. In another embodiment, the code queries a test instrument for circuit test data types and, in response to results from the query, builds the user-selectable representations of circuit test data 302–310. In yet another embodiment, a user might manually enter a number of circuit test data items into the report format editor 104.

As previously alluded to, the report format editor 104 may employ a variety of mechanisms to assist a user in easily identifying what kinds of circuit test data 302a, 308a are placed in their ASCII report format 312. In one embodiment, the report format editor 104 comprises code to associate identifying colors with the representations of circuit test data 302, 308a appearing in the ASCII report format 312. For example, each of the circuit test data representations 302–310 displayed on the left side of the FIG. 3 GUI 300 may be displayed in a color that is unique to the test data item, or at least unique to its test data type. Placed representations of the circuit test data 302a, 308a then appear in the same color so that the representations 302–310 on the left may be easily referred to for more information about (e.g., the name of) data 302a, 308a that has been placed in the ASCII report format 312. Alternately, or additionally, the report format editor 104 may comprise code to 1) associate a name with each of the placed representations of circuit test data 302a, 308a, and 2) cause the name 314 to be displayed when a graphical pointer 316 hovers over its corresponding representation of circuit test data 308a (i.e., a data item's name is displayed when a user "hovers" over the data item).

Once a representation of circuit test data 302a, 308a has been placed in the ASCII report format 312, it may be easily dragged and repositioned. Further, the report format editor 104 may comprise code that enables placed representations of circuit test data 302a, 308a to be graphically resized within the ASCII report format 312. This may be accomplished, for example, by providing the circuit test data 302a, 308a with graphically selectable "handles" (e.g., persistently displayed handles or hover (pop-up) handles). In one embodiment, selection of a placed representation of circuit test data 302a (e.g., via a mouse-click) also causes the GUI 300 to provide an option to specify a data format for the selected representation. The option may take the form of a fill-in field (on a menu bar, for example) that allows a user to specify a desired width of circuit test data, a desired number of significant digits of the data item, or one of an number of data formats for data item (e.g., integer, text, or scientific notation).

Figure 5:
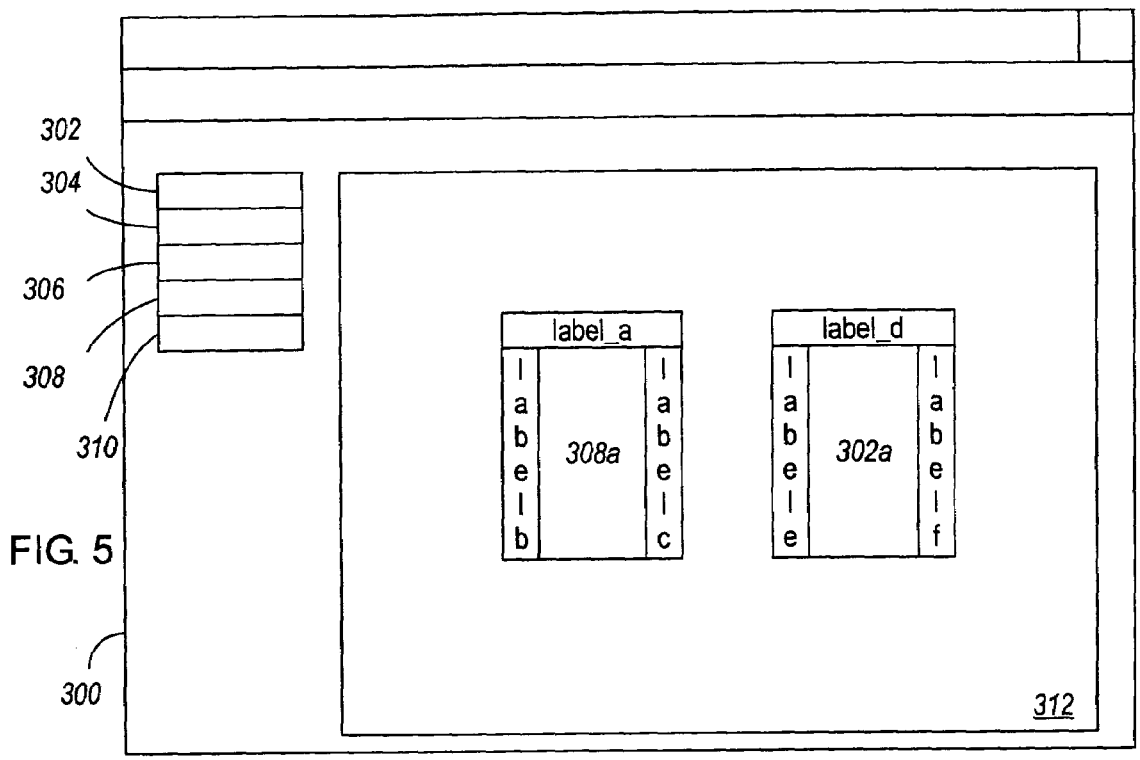
Figure 6:
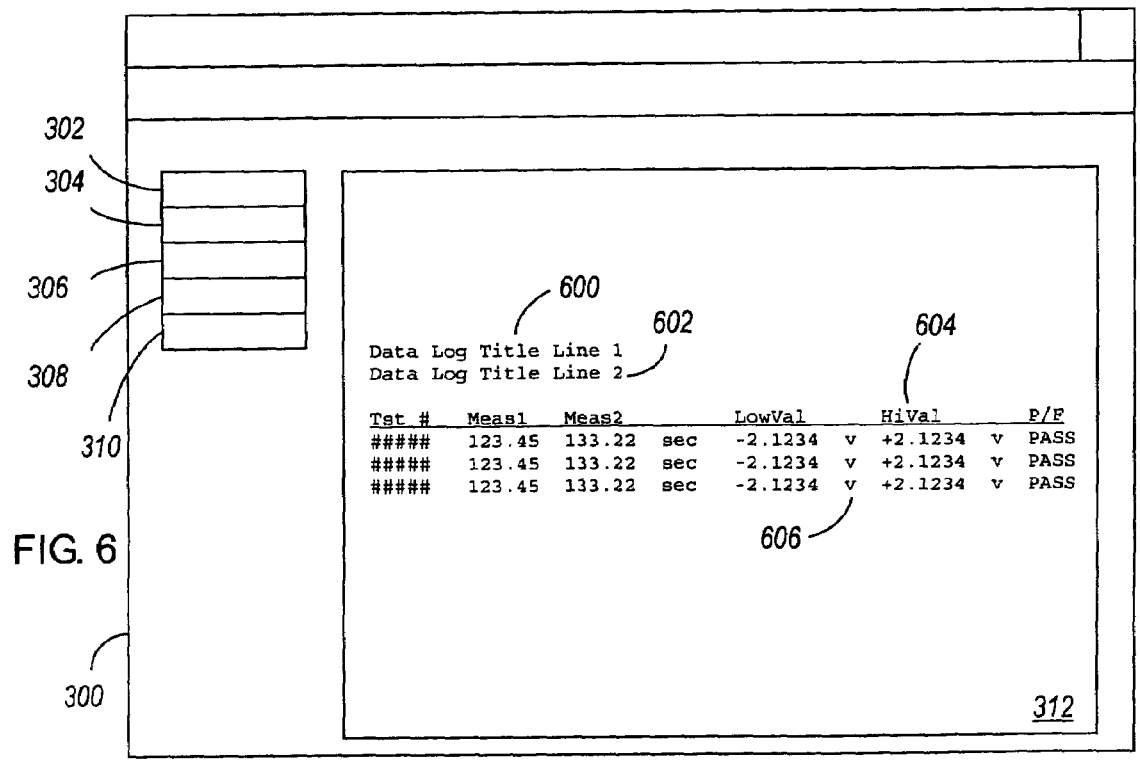

FIG. 5 shows an embodiment of the report format editor 104 wherein each representation of circuit test data 302a, 308a is, by default, associated with a number of programmable label fields (label_a–label_c for item 308a, and label_d–label_f for item 302a). By way of example, the programmable label fields may comprise a column header field (label_a, label_d), a preamble field (label_b, label_e), and a postamble field (label_c, label_f). By clicking on one of the fields, a user can fill in the field with a title, measurement unit, mathematical indicator, separator character (e.g., a colon), or other information that improves report readability. The user might also be given an option to delete or hide some or all of the label fields. Alternately, or additionally, the menus of the report format editor's GUI may provide a user with various options to place context fields 600, 602, 604, 606 in the ASCII report format. As shown in FIG. 6, these context fields 600–606 may comprise various sorts of text and/or numeric fields.

Although a variety of means for configuring an ASCII report format 312 have been disclosed, it is preferable that all of the means be implemented using a non-proportional font, and that a user is displayed a WYSIWYG (what you see is what you get) report format. Further, although the figures show only a single row of columns, the GUI 300 of the report format editor 104 could alternately show multiple rows of columns. Alternately, the GUI 300 of the report format editor 104 could display multiple formatting windows, each of which corresponds to a tier in a hierarchical report. For example, a report might comprise tiers for: lot, cassette, wafer, and device. Each window might appear as shown in FIG. 3.

While illustrative and presently preferred embodiments of the invention have been described in detail herein, it is to be understood that the inventive concepts may be otherwise variously embodied and employed, and that the appended claims are intended to be construed to include such variations, except as limited by the prior art.

What is claimed is:

1. A report format editor for circuit test, comprising: computer readable media; and
program code, stored on the computer readable media, comprising:
program code to display a graphical user interface, the graphical user interface displaying i) a number of user-selectable representations of circuit test data, and ii) a user-modifiable ASCII report format that is formed, at least in part, of placed ones of said user-selectable representations of circuit test data; and
program code to i) interpret relative sizes and placements of elements forming said user-modifiable ASCII report format, and ii) generate an ASCII format description file in response to said interpretation.

2. The report format editor of claim 1, further comprising code to read a file of circuit test data types and, in response thereto, build said number of user-selectable representations of circuit test data.

3. The report format editor of claim 1, further comprising code to query a test instrument for circuit test data types and, in response to results from said query, build said number of user-selectable representations of circuit test data.

4. The report format editor of claim 1, wherein said user-selectable representations of circuit test data are displayed in a persistently visible portion of the graphical user interface.

5. The report format editor of claim 1, wherein said user-selectable representations of circuit test data are provided via a pull-down menu of the graphical user interface.

6. The report format editor of claim 1, further comprising code that enables a user to drag and drop the user-selectable representations of circuit test data within the ASCII report format.

7. The report format editor of claim 1, further comprising code to associate identifying colors with said placed ones of said user-selectable representations of circuit test data.

8. The report format editor of claim 1, further comprising code to i) associate names with said placed ones of said user-selectable representations of circuit test data, and ii) cause the name of a placed representation of circuit test data to be displayed when a graphical pointer hovers over the placed representation of circuit test data.

9. The report format editor of claim 1, further comprising code that enables said placed representations of circuit test data to be graphically resized within the ASCII report format.

10. The report format editor of claim 1, wherein ones of said placed ones of said user-selectable representations of circuit test data are associated with programmable label fields.

11. The report format editor of claim 1, wherein said programmable label fields comprise a column header field.

12. The report format editor of claim 1, wherein said programmable label fields comprise preamble and postamble fields.

13. The report format editor of claim 1, wherein said graphical user interface further displays a number of user-selectable context fields that may be placed in the ASCII report format.

14. The report format editor of claim 1, further comprising code to read a saved ASCII format description file, conduct a consistency check on the contents thereof, and display a user-modifiable ASCII report format based thereon.

15. The report format editor of claim 1, wherein, upon selection of one of the placed representations of circuit test data, the graphical user interface provides an option to specify a data format for the selected representation.

16. A circuit test system, comprising:
- computer readable media; and
- program code, stored on the computer readable media, comprising:
  - code to display a graphical user interface, the graphical user interface displaying i) a number of user-selectable representations of circuit test data, and ii) a user-modifiable ASCII report format that is formed, at least in part, of placed ones of said user-selectable representations of circuit test data;
  - code to i) interpret relative sizes and placements of elements forming said user-modifiable ASCII report format, and ii) generate an ASCII format description file in response to said interpretation; and
  - code to read the ASCII format description file and format circuit test data in accordance therewith.

17. The system of claim 16, further comprising code to read a file of circuit test data types and, in response thereto, build said number of user-selectable representations of circuit test data.

18. The system of claim 16, wherein said code to format circuit test data receives and processes a real-time stream of circuit test data.

\* \* \* \* \*